US010299410B1

(12) United States Patent
Patrick et al.

(10) Patent No.: US 10,299,410 B1
(45) Date of Patent: May 21, 2019

(54) COOLING INTAKE DUCT

(71) Applicant: Amazon Technologies, Inc., Seattle, WA (US)

(72) Inventors: Shawn Duane Patrick, Issaquah, WA (US); Frank Andrew Glynn, Leesburg, VA (US); Alan Joseph Lachapelle, Reston, VA (US); Giorgio Arturo Pompei, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 226 days.

(21) Appl. No.: 14/722,016

(22) Filed: May 26, 2015

(51) Int. Cl.
*H05K 7/20* (2006.01)

(52) U.S. Cl.
CPC ..... *H05K 7/20745* (2013.01); *H05K 7/20145* (2013.01)

(58) Field of Classification Search
CPC .......... H05K 7/20745; H05K 7/20145
USPC .......................................... 454/184
See application file for complete search history.

(56) References Cited

U.S. PATENT DOCUMENTS

| 6,616,524 | B2 * | 9/2003 | Storck, Jr. ........... F24F 7/06 361/678 |
| 7,643,291 | B2 * | 1/2010 | Mallia .............. H05K 7/20736 361/679.46 |
| 7,718,889 | B2 * | 5/2010 | Rasmussen ............ G06F 1/189 174/50 |
| 8,345,419 | B2 * | 1/2013 | Sun ................... H05K 7/20736 361/679.46 |
| 2002/0055329 | A1 * | 5/2002 | Storck, Jr. ............. F24F 7/06 454/186 |
| 2005/0237716 | A1 * | 10/2005 | Chu ................... H05K 7/20736 361/696 |
| 2008/0204999 | A1 | 8/2008 | Clidaras et al. |
| 2008/0239659 | A1 * | 10/2008 | Kundapur .......... H05K 7/20736 361/679.49 |
| 2009/0156114 | A1 * | 6/2009 | Ahladas ............. H05K 7/20745 454/184 |
| 2011/0288664 | A1 * | 11/2011 | Archibald ............ G06F 1/206 700/90 |

* cited by examiner

*Primary Examiner* — Gregory L Huson
*Assistant Examiner* — Dana K Tighe
(74) *Attorney, Agent, or Firm* — Kilpatrick Townsend & Stockton LLP

(57) ABSTRACT

A modular cooling apparatus for cooling one or more rack-mounted electronic component enclosures in a datacenter includes a base duct section and a duct assembly. The base duct section includes an inlet to receive a cooling airflow and an outlet to transfer to the cooling airflow to the duct assembly. The duct assembly is connected to the base duct section. The duct assembly includes one or more modular duct sections. Each of the one or more modular duct sections has a vent and is configured such that the vent aligns with an exterior opening in the respective one of the one or more electronic component enclosures.

20 Claims, 6 Drawing Sheets

COOLING INTAKE DUCT

BACKGROUND

A datacenter typically contains a collection of computer servers and components for the management, operation and connectivity of those servers, including power management components such as automatic transfer switches. Even in isolation, datacenter electronic components may generate sufficient heat that proactive temperature management becomes important to prolong the life of the components and ensure the smooth and continuous operation of the datacenter.

Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments herein described relate to apparatus and methods for regulating the temperature of electronic components in a datacenter. Electronic components that may require cooling include, for example, automatic transfer switches and servers. Existing strategies for temperature management include providing a flow of cool air from a sub-floor space below the electronic components, so that cool air passes up through perforated panels in the floor.

Embodiments described herein include modular cooling apparatus that include modular, connectible duct elements. The modular cooling apparatus embodiments described herein transfer a portion of a stream of air, for example from perforated panels or vents in the floor, into the enclosures of various electronic components arranged in an array. This approach efficiently directs airflow to cool the electronic components.

Some embodiments described herein also provide management of cables connected to the electronic components. For example, one or more of the modular duct elements can include one or more cable retention features. The one or more cable retention features can be configured to support a portion of the weight of a cable or cables connected with one or more of the electronic components, so that stresses on connections between the cable(s) and the electronic component(s) are mitigated.

Figure 1:
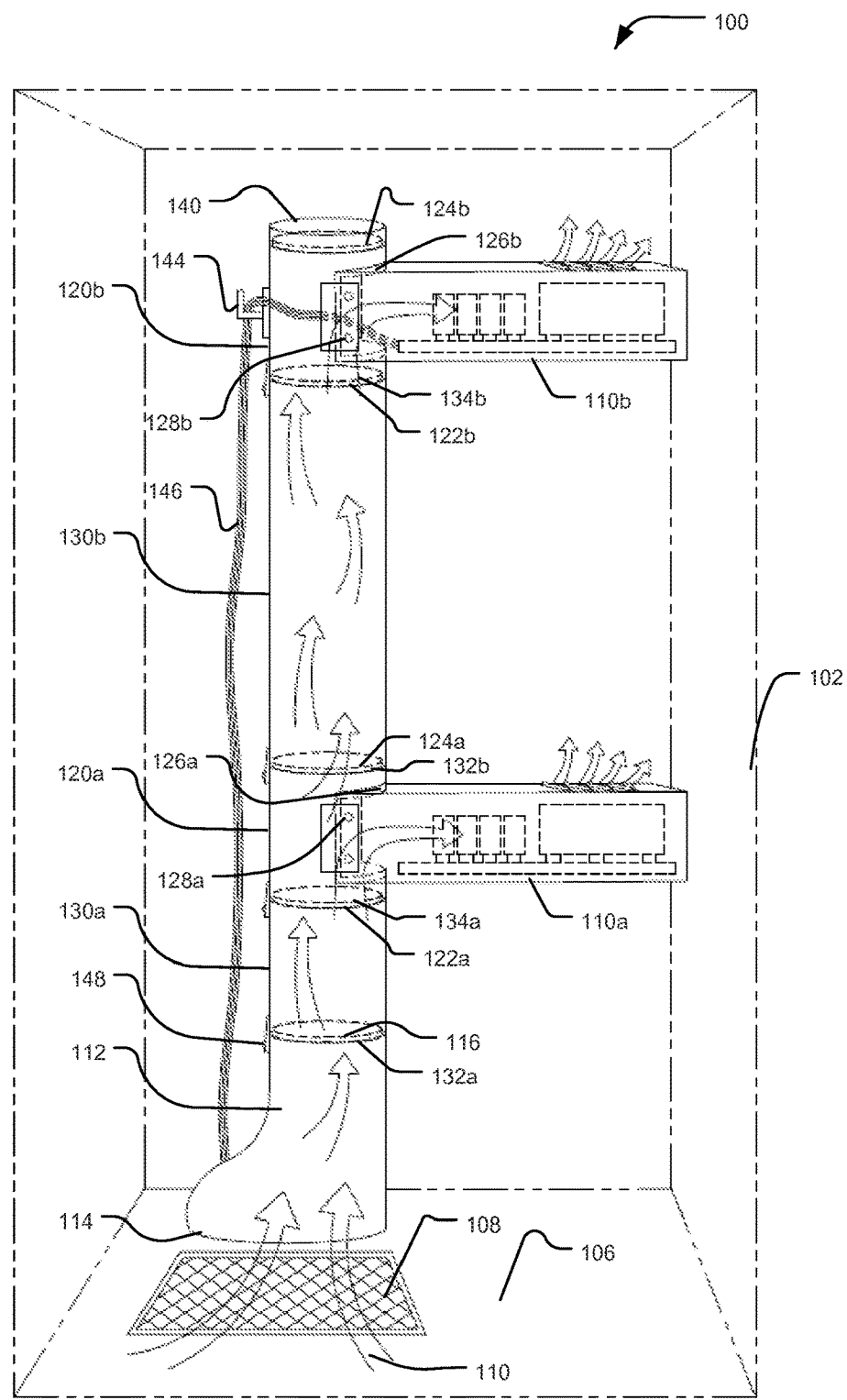
FIG. 1 is a side view schematic illustrating a first example system for cooling electronic components in a rack, in accordance with embodiments.

FIG. 1 illustrates an example system 100 for cooling electronic component enclosures in a rack 102, in accordance with embodiments. In this example system 100, two electronic component enclosures 110a and 110b are shown and arranged vertically in the rack 102 above a floor 106 having a pressurized cool air reservoir and perforated floor sections 108 for venting a cooling stream of air. The electronic component enclosures may contain computing hardware, such as servers; components of a power management system, such as automated transfer switches for controlling the consistency of power supply to elements of the datacenter; or any other modular electronic component suitable for arrangement in an array.

The system 100 includes a base duct section 112 and a plurality of modular stacked elements 120a, 120b, 130a, 130b and 140 forming a duct assembly. The base duct section 112 has an inlet 114 open and proximate to the perforated floor section 108, so that a portion of the cooling stream of air flows into the base duct section and toward a base duct section outlet 116. The base duct section outlet 116 is connected with an inlet 132a of a first spacing section 130a. The base duct section 112 can also be referred to as an intake duct section.

In the illustrated embodiment, the inlet 114 of the base duct section 112 is roughly ellipsoidal and substantially larger than the outlet 116 of the base duct section 112. In alternate embodiments, the inlet 114 and the outlet 116 have any suitable size and/or shape including, but not limited to, the same size and/or shape. The subsequent inlets and outlets, such as the outlet 116 of the base duct section 112 and the inlet 132a of the first spacing section 130a are substantially circular. The inlets and outlets, however, can have any suitable shape. For example, the inlets and outlets may be substantially semicircular, semi-ellipsoidal, square, rectangular, irregular or any other suitable shape. Also, alternative embodiments of the base duct section 112 may have any suitable shape including, but not limited to, circular, ellipsoidal, rectangular, or irregular inlet shape.

In the illustrated embodiment of the system 100, the connection between the base duct section outlet 116 and the first spacing section inlet 132a is a slip junction. For example, a region of the base duct section outlet can decrease in cross-sectional area to form a narrow shelf, such that the matching part of the first spacing section inlet 132a rests on and surrounds the base duct section outlet. The first spacing section 130a fits over the base duct section 112, forming a substantially closed periphery and directing a stream of air upwardly into the subsequent modular duct elements.

In embodiments, the junction between elements, such as the connection between first spacing section 130a and the base duct section 112, can be any suitable junction for connecting air-transferring ducts or pipes. For example, embodiments may use a short slip junction, a long slip junction, flanges, or any other suitable connection. Junctions may include adapters, such as rubber gaskets, clips, tape, O-rings, or any other suitable part to better seal or connect adjacent inlets and outlets. Embodiments of duct elements can alternatively join with pipe or duct adapters.

The first spacing section 130a has a first spacing section outlet 134a that connects with an inlet 122a of a first modular duct section 120a. The first modular duct section 120a has an inlet 122a, outlet 124a, and a vent 126a such that a part of the stream of air passing through the modular duct sections can be diverted out of the first modular duct section vent 126a and into the first electronic component enclosure 110a, with a remainder of the stream of air passing up and through the remaining modular stacked elements. In the illustrated embodiment, the first modular duct section 120a and the first spacing section 130a are attached with each other at a slip junction, similar to the attachment described above in regard to the attachment of the base duct section 112 and first spacing section 130a.

A second spacing section 130b is attached above the first modular duct section 120a. The second spacing section 130b also has an inlet 132b and outlet 134b. In the illustrated embodiment, the second spacing section 130b is significantly longer than the first spacing section 130a, and configured to bypass an empty space between the electronic component enclosures 10a and 110b.

Spacing sections in alternative embodiments may have a variety of lengths. In some embodiments, spacing sections may be modular and configured to match a set of common lengths. For example, a spacing section can have a standard height corresponding to a height between adjacent racks in a server cabinet, or any integer multiple of a standard height. In alternative embodiments, the spacing sections may be modified or cut short according to need.

In the illustrated embodiment, a second modular duct section 120b is attached above the second spacing section 130b, and has the same components as the first modular duct section 120a described above, including an inlet 122b, outlet 124b, and vent 126b. The second modular duct section 120b additionally has a cable retention feature 144 for supporting one or more cables 146 associated with and/or connected to one or more of the electronic component enclosures 110a and 110b. The second modular duct section 120b is attached with the enclosure 110b such that the vent 126b is positioned to output cooling airflow into the enclosure 110b.

A duct cap 140 is attached at the outlet 124b of the second modular duct section 120b. The duct cap 140 prevents outflow of cooling airflow from the second modular duct section outlet 124b.

The duct assembly formed by the first and second modular duct sections 120a, 120b, the first and second spacing sections 130a, 130b and duct cap 140 acts to direct the stream of cooling air through the duct assembly and into the electronic component enclosures 110a, 110b. The respective parts of the stream of cooling air pass through and convey heat away from the electronic components within each of the enclosures 110a, 110b.

The modular duct sections 120a and 120b can also have connecting features 128a and 128b for connecting each the duct sections with the electronic component enclosures 110a and 110b, respectively. In embodiments, these connecting features can be flanges or other positive surface features on an exterior of the duct sections, arranged to match or to mate with surface features on the electronic component enclosures. For example, the connecting features can be two flanges having holes for inserting one or more screws, bolts, rivets, or other mechanical connector.

The modular duct sections 120a and 120b and intermediate spacing sections 130a and 130b can have securing features 148, such that modularly stacked sections may be secured to one another. For example, the securing features 148 can include a flange extending from one section and a matching feature disposed on another section. In embodiments, the positions of the flange and matching feature are compatible on each section, so that the sections can be arranged and secured in any order. In alternative embodiments, any suitable securing feature or features can be used, or may be omitted.

In various embodiments, the number of modular duct sections and spacing sections can vary according to the number of electronic component enclosures and the separation between the enclosures. For example, in a fully-utilized electronic component rack, electronic component enclosures may fill every available space in the rack. A corresponding cooling system can have a base duct section, many modular duct sections, and a duct cap, without any intervening spacing sections. As another example, a cooling system can have one spacing section between the base duct section and the first or lowermost modular duct section, and be otherwise populated exclusively by modular duct sections. In another example, in a sparsely utilized electronic component rack, a stack of elements may include as few as one modular duct section, and any number of spacing sections according to the position of the electronic component enclosure(s) in the component rack.

In embodiments, the venting duct sections and intermediate spacing sections are modular, such that an arbitrary number of duct sections and spacing sections may be assembled into a duct assembly in a suitable order according to the order of electronic component enclosures and empty spaces in a vertical array. The inlets and outlets of each of the duct and spacing sections can be compatible, such that either type of section may stack and attach together in any order. Arrangements of a duct assembly may include multiple adjacent modular duct sections with vents, multiple adjacent intermediate spacing sections without vents, alternating arrangements of venting duct sections and spacing sections, or any suitable combinations of venting duct sections and spacing sections.

In some embodiments, the height of the modular venting duct sections may be aligned with a standard spacing between rails or attachment features in a rack, so that an assembled stack of adjacent modular venting duct sections can align correctly with adjacently configured electronic component enclosures inserted into or attached to the rack. Likewise, the height of spacing sections may be aligned with the standard spacing, or with an integer multiple of the standard spacing, to accommodate empty spaces in the rack. Additionally, the height of the base duct section can be configured according to a standard height of a rail in an electronic component rack, such that a modular duct section attached immediately above the base duct section, or above a combined stack of a base duct section and one or more intermediate sections, aligns with a height of an electronic component enclosure installed in the rack. In some embodiments, the height of the base duct section is configured according to a standard height of a lowest rail, or configured to align with the lowermost electronic component enclosure in the rack.

In embodiments, the modular duct sections and spacing sections have alternating smaller and larger cross sections at the inlets and outlets, in the manner of a slip joint, such that two adjacent sections join at a slip junction, as shown in the example system 100. In other embodiments, a variety of joints may be used. For example, a slip junction can be configured to slide so that the length of the junction can be varied, so as to accommodate small variances in the height of the electronic component enclosures. In another example, a coupling can be used to join adjacent duct sections. In alternative embodiments, modular duct and spacing sections can have flanged inlets and outlets, and a flexible coupling can be attached about the coupled flanges so as to secure them together and reduce or prevent leakage through the seam. Seams between inlets and outlets of sections can be additionally secured by any suitable part, for example, with a gasket, sealant, tape, adhesive, clip, or any suitable mechanical connector.

In embodiments, the base duct section inlet is larger than the base duct section outlet, such that the cross-sectional area of the base duct section decreases from the inlet to the outlet, increasing the speed of the airflow therein. According to some embodiments, the inlet is sized to cover a majority of a perforated floor tile, or can be sized to cover a majority of two or more perforated floor panels. In alternative embodiments, the base duct section inlet is the same size as the base duct section outlet. The base duct section can be omitted entirely, with the stream of cooling air flowing directly into either a modular venting duct section or a spacing duct section.

In embodiments, when an electronic component enclosure is added to the rack, an adjacent intermediate spacing section can be removed from an existing duct assembly and replaced with a vented modular duct section to provide airflow to the new enclosure. Also, if an enclosure is removed from the rack, an associated modular duct section can be removed from the stack and replaced with an intermediate spacing section.

The modular duct sections can have additional features for closing the vent, such that a venting modular duct section can be effectively transformed into an spacing section by closing the vent without necessitating the removal of the section. For example, a plate can be used to cover the vent. The plate can be configured to attach with the modular duct section by means of any suitable fastener. The plate can be made from any suitable material, such as plastic or metal. Either or both of the plate and modular duct section can include one or more holes for screws or bolts. Alternatively, or in addition, the plate can be attached to the modular duct section by way of one or more slots or other suitable surface feature, by way of magnets, or may be adhered. The vent can be covered by a membrane rather than, or in addition to, a plate.

Figure 2:
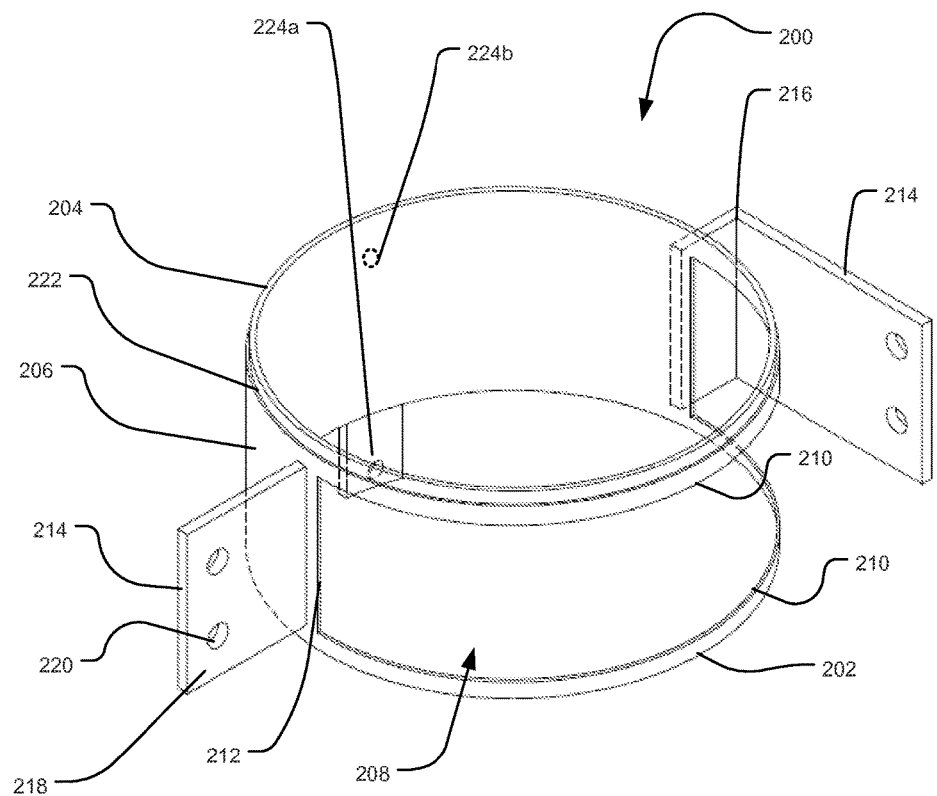
FIG. 2 is a perspective view of a vented modular duct section of FIG. 1, in accordance with embodiments.

FIG. 2 is a perspective view of a modular venting duct section 200, in accordance with embodiments. The modular duct section 200 has a substantially circular cross-section, with a lower rim 202 forming the inlet, an upper rim 204 forming the outlet, and a curved sidewall 206. The upper rim 204 is smaller in cross-sectional area than the lower rim 202 or curved sidewall 206, forming a shelf 222.

The upper rim 204 and shelf 222 are configured to slidingly attach with a lower rim of an additional duct section or spacing section, so that an assembly of modular duct sections, or of duct sections and spacing sections, can be fitted together. Modular duct sections can also have suitable securing features to prevent separation of adjacent duct sections. For example, in the illustrated embodiment the modular duct section 200 includes securing features 224a and 224b. The securing feature 224a is a flange with a through hole and the securing feature 224b is a through-hole through the sidewall 206. Any suitable attachment element, such as a bolt, screw, pin, rivet, or other suitable attachment means, can be used in conjunction with the securing features 224a, 224b. Other possible securing features can include an elastically flexible flange with a through-hole or recess and a positive surface feature, respectively, so that parts can "snap" together; or securing features may be any other suitable securement means.

The modular duct section 200 has a vent 208 shaped to partially accommodate a portion of an electronic component enclosure having the vent into which the cooling airflow is to be directed. The vent is configured to accommodate a portion of an electronic component enclosure, such that horizontal curved edges 210 abut a top and bottom of the enclosure, and vertical edges 212 abut a side or end of the enclosure, so that a vent or opening in the electronic component enclosure is enclosed within the modular duct section.

Connecting features 214 are formed of flanges extending outward from an exterior of the curved sidewall 206 at positions on a plane parallel to the vertical edges 212 in the vent 208. The flanges have a facing portion configured to abut the electronic component enclosure. The flange can include a corner 216 to wrap around a corner of an enclosure. The flanges 214 can connect the modular duct section with the enclosure by way of any suitable connector, for example, by way of one or more screws, bolts, rivets, or other attachment means passing through holes 220 in the flanges.

The modular duct section can be connected with an electronic component enclosure by way of the vent itself, without additional connecting features. For example, a vent can be configured to closely match an exterior height of an electronic component enclosure, so that friction retains the vent. One or both of the horizontal surfaces 210 can be configured with a retention surface, such as a soft rubber, adhesive, tacky coating, or other suitable surface for aiding retention of the duct section on the enclosure.

Figure 3:
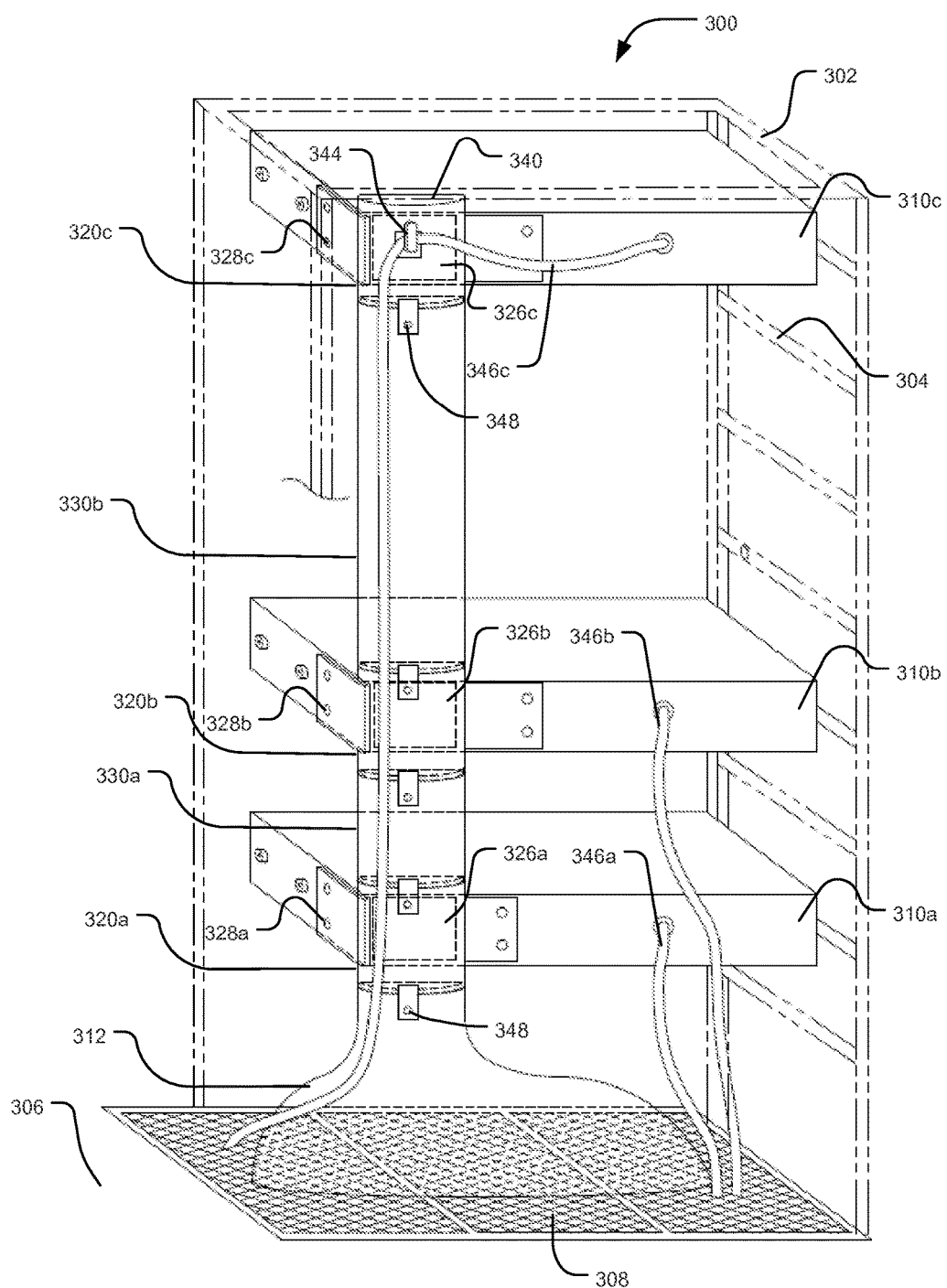
FIG. 3 is a front view of a second example system for cooling electronic components in a rack, showing an alternative duct section shape and configuration.

FIG. 3 is a front view of another example cooling system 300, showing an alternative duct section shape and additionally how a duct assembly can be configured to connect between a base duct section and electronic component enclosures in a vertical array.

In the cooling system 300, electronic component enclosures 310a, 310b, and 310c are arranged in a vertical array in a rack 302 along regularly spaced rails 304. The electronic component enclosures 310a, 310b and 310c are positioned above a floor 306 having a perforated section 308 through which a stream of cooling air flows upward.

Above the perforated section 308 is positioned a base duct section 312. The base duct section 312 is connected with a duct assembly formed of modular duct sections 320a, 320b and 320c and modular spacing sections 330a and 330b. The modular duct sections 320a, 320b, and 320c are also connected with the electronic component enclosures 310a, 310b and 310c by way of flanges and connection features 328a, 328b and 328c, respectively.

The modular duct sections 320a, 320b and 320c in the example cooling system 300 have a substantially semi-circular cross section, with vents 326a, 326b and 326c disposed on a flat sidewall of each modular duct section. The vents 326a, 326b and 326c are arranged facing and adjacent to air inlets on each of the electronic component enclosures 310a, 310b and 310c, respectively.

The topmost modular duct section 326c has cable retention feature 344 for partially supporting the weight of a cable 346c. Other modular duct sections can be configured with or without cable retention features depending, for example, on a length of the cable which may need to be supported. For example, cable 346c may require support because the cable emanates from the topmost enclosure 310c and terminates near the floor, while cables 346a and 346b may not require additional support. Suitable cable retention features can be included on any modular duct or spacing section.

In the example system 300 as shown, modular duct sections 320a, 320b and 320c and spacing sections 330a and 330b are configured having standard heights associated with a regular spacing between the rails 304. Thus, each of the modular duct sections, as well as the spacing section 330a, have a common height associated with one space. The spacing section 330b has a height associated with three spaces. In alternative embodiments, a selection of modular spacing elements can be provided having heights configured to match any suitable integer multiple of a single rack space, to fit a variety of electronic component configurations in the rack. In some alternative embodiments, a series of modular spacing elements can be assembled in series to perform the same function.

The modular duct sections and spacing sections attach to one another in the illustrated system 300 by joining at slip junctions, comparable to the joints between sections shown in FIG. 1; but may join according to any suitable joint between ducts or air-conveying pipes. Additionally, modular duct sections and spacing sections in this system 300 are secured together by securement features 348, which repeat on each part. However, in alternative embodiments, securement features can take any suitable form or can be absent.

Figure 4:
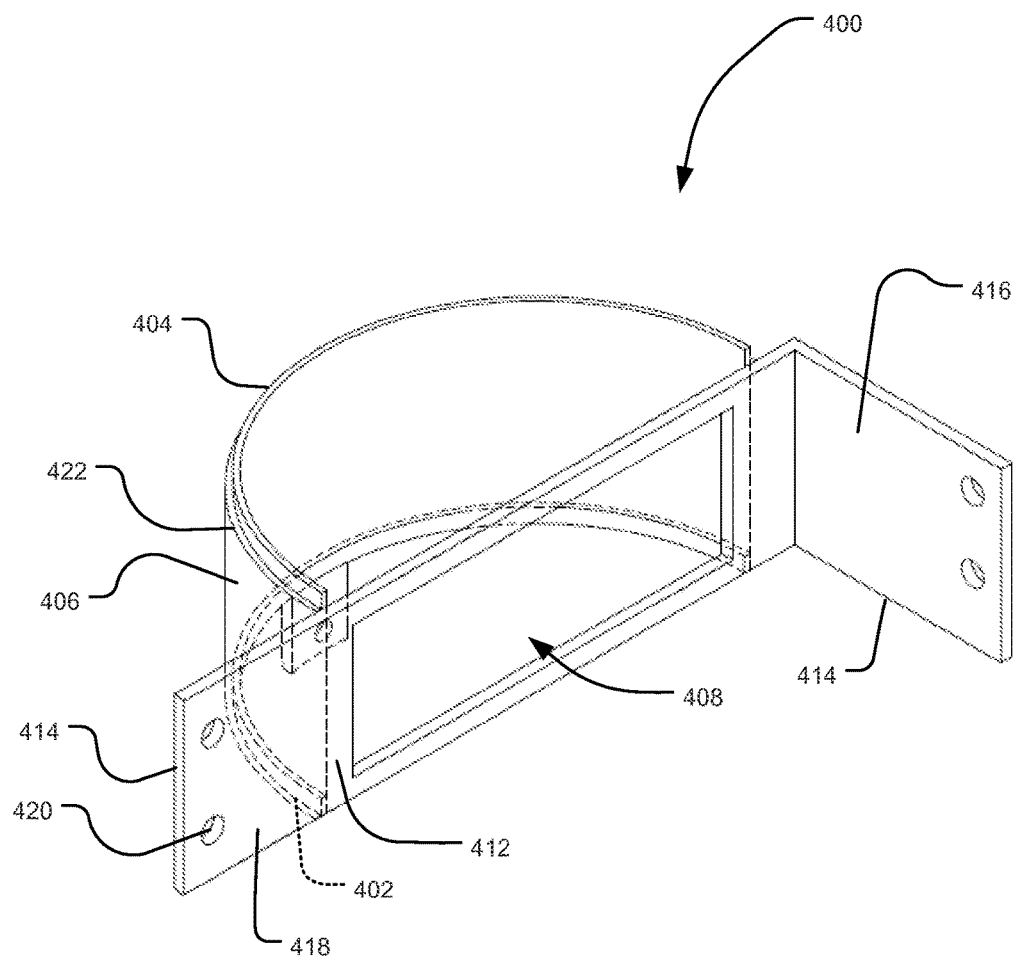
FIG. 4 is a perspective view of an alternative vented modular duct section of FIG. 3, in accordance with embodiments.

FIG. 4 is a perspective view of an alternative modular duct section 400, in accordance with embodiments. The modular duct section 400 has a substantially semi-circular cross-section, with a lower rim 402 forming the inlet, an upper rim 404 forming the outlet, a curved sidewall 406 and a flat sidewall 412. The upper rim 404 is smaller in cross-sectional area than the curved sidewall 406, forming a shelf 422, and configured to slidingly fit within a groove in the lower rim of another duct section to removably attach two adjacent duct sections together.

The modular duct section 400 also has flanges for providing connecting features 420. The flanges have facing portions 418 and 416 configured to abut an adjacent electronic component enclosure, so that the duct section can be connected to the enclosure by means of any suitable connecter, for example: one or more screws, bolts, rivets, or other attachment means passing through connecting features or holes 420 in the flanges.

In alternative embodiments, connecting features other than through-holes may be provided in the flanges. For example, the modular duct section can include hooks or other positive surface features configured to interact with surface features of an electronic component enclosure. Furthermore, although the modular duct section 400 shown has flanges with a bend for wrapping around a corner of an electronic component enclosure, alternative embodiments of modular duct sections can be configured to attach at a midpoint of an enclosure and lack wrap-around features.

Figure 5:
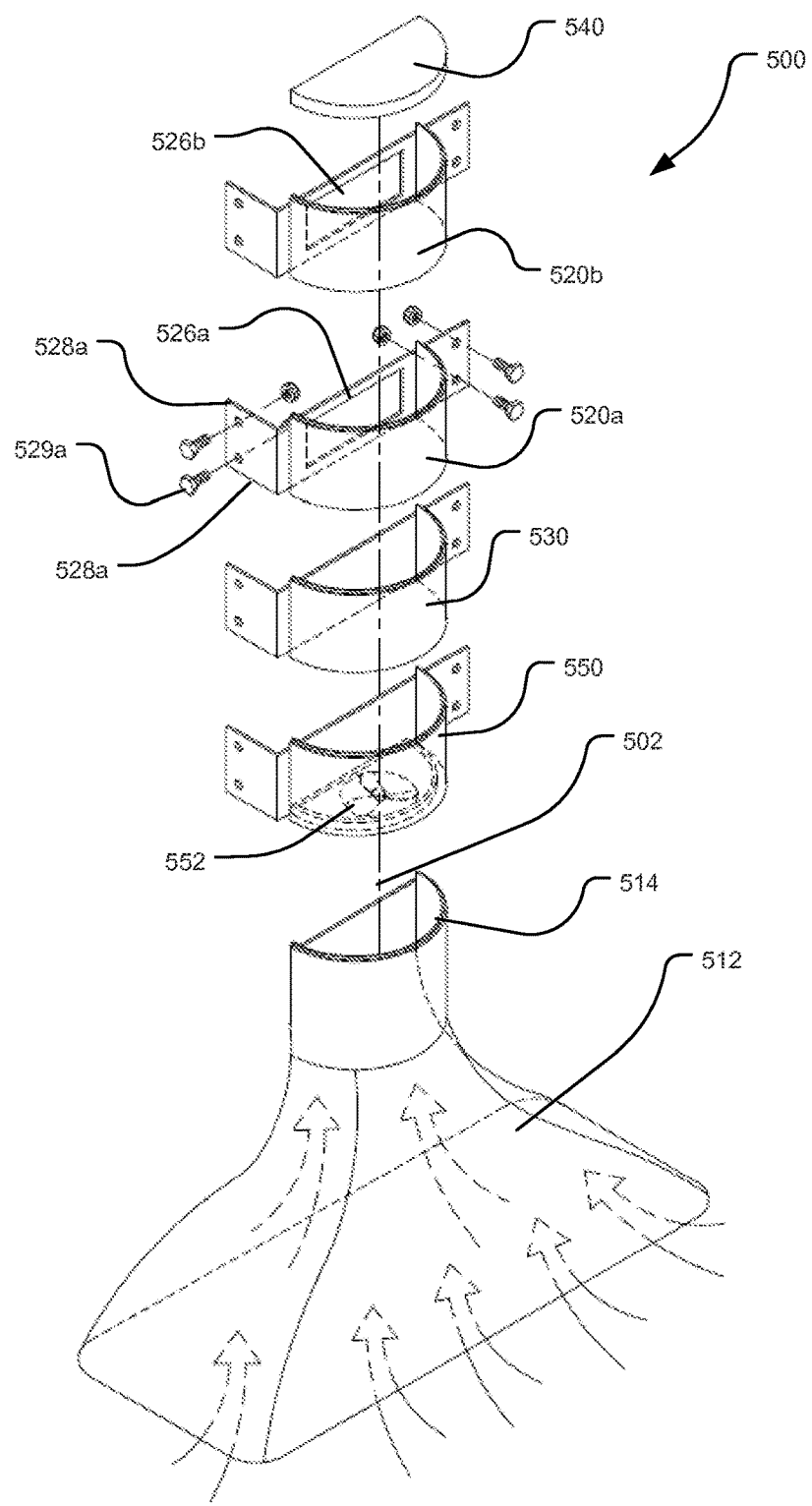
FIG. 5 is an exploded view of a third example system for cooling electronic components, in accordance with embodiments.

FIG. 5 is an exploded view of a third example system 500 for cooling electronic components, in accordance with embodiments. In the example system 500, modular duct sections 520a and 520b, spacing section 530, and fan section 550 are arranged vertically in a duct assembly. The duct assembly is aligned along a common vertical axis 502 with an outlet 516 of a base duct section 512. The base duct section 512 collects a stream of cooling air from below the assembly and transfers it into the duct assembly.

The fan section 550 is configured to be modular, so that it can be emplaced at any location in the duct assembly, but is shown immediately adjacent to the base duct section 512. In embodiments, the fan section is powered and includes a fan 552, so that the fan section can be operable to increase a flow rate of cooling air from the base duct section into the duct assembly. In embodiments, the fan section 550 is part of the duct cap 140, 340, 540 to provide air into the duct assembly via the duct cap. Introduction of cooling air into the duct assembly via a duct cap fan can be used to supplement the cooling airflow distributed to the electronic component enclosures and/or to provide cooling airflow if a lower portion of the duct assembly is removed and the resulting opening in the duct assembly is blocked to inhibit or prevent airflow out of the resulting opening. In alternative embodiments, the fan section can be connected to a controller (not shown) associated with one or more of the electronic components within the electronic component enclosures, for implementing active temperature management.

Figure 6:
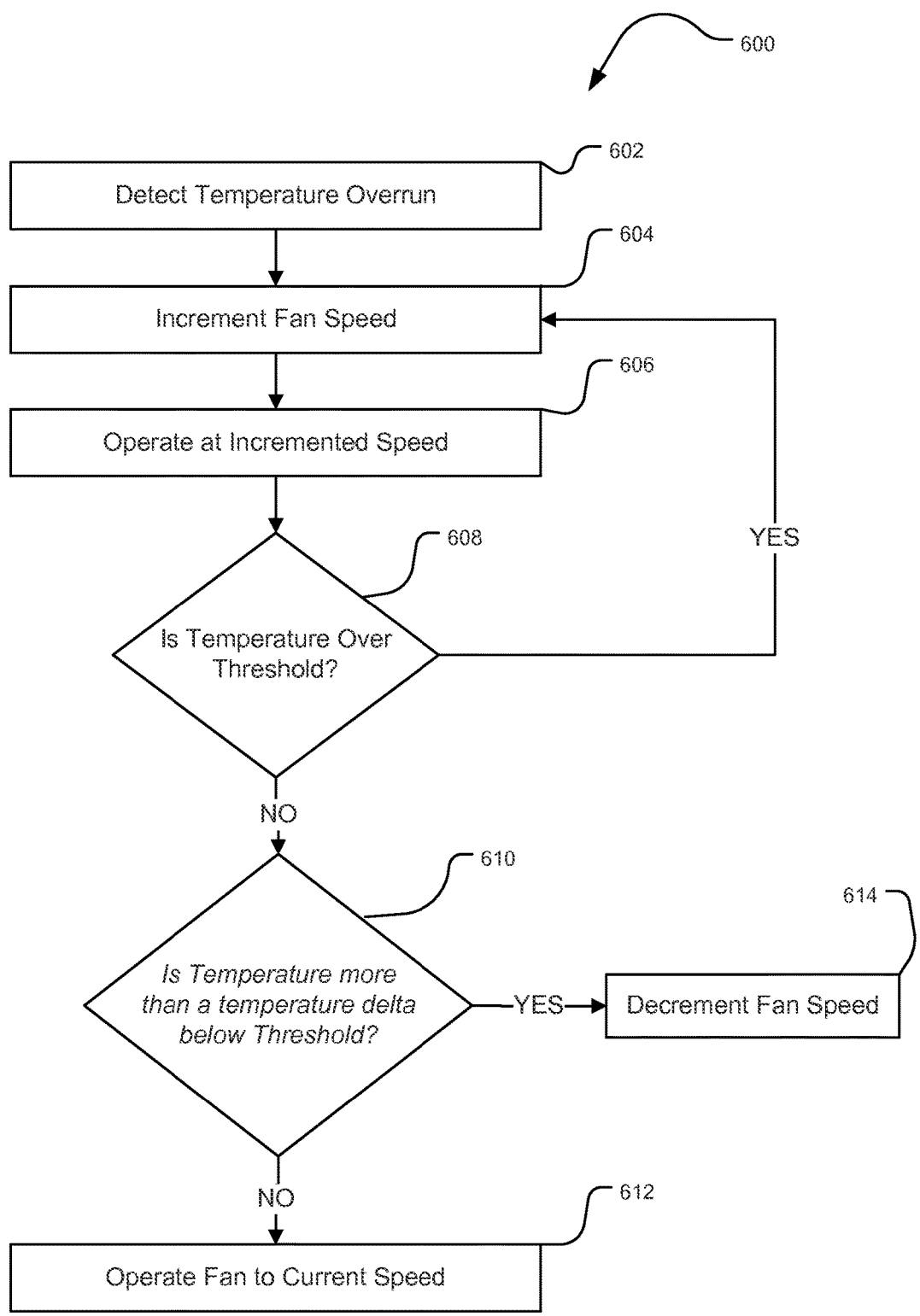
FIG. 6 is an example process for controlling a fan speed, in accordance with embodiments.

FIG. 6 shows an example process 600 for controlling a speed of the fan 552 in FIG. 5. In the process 600, one or more sensors in one or more of the electronic component enclosures detect a temperature overrun (act 602) when a temperature within the enclosure exceeds a threshold. The detection of the temperature overrun triggers a controller to increase a speed of the fan 552 (FIG. 5) by a pre-set increment (act 604). The controller permits the fan to operate at the increased speed for a pre-set period of time (act 606). When the pre-set period of time has elapsed, the controller determines, using the one or more sensors, whether the temperature exceeds a threshold temperature (act 608). If the temperature still exceeds the threshold, the controller increments the fan speed again, and repeats acts 604, 606 and 608. If the temperature is no longer above the threshold, the controller determines if the temperature is more than a suitable temperature delta (e.g., three degrees Fahrenheit) below the threshold (act 610). If the temperature is less than the threshold and not more than the suitable temperature delta below the threshold, the current fan speed is maintained (act 612). If the temperature is more than the suitable temperature delta below the threshold, the controller decrements the fan speed (act 614).

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A modular cooling apparatus for cooling a vertical array of automatic transfer switches located in a datacenter, the datacenter having a floor above a subfloor space used to introduce cooling air into the datacenter, the modular cooling apparatus comprising:
   a base duct section having an inlet and an outlet, the inlet being configured to be arranged abutting the floor to receive a cooling airflow transferred from the subfloor space through the floor, wherein the base duct section is movable with respect to the floor while abutting the floor; and
   a plurality of modular duct sections, each one of the plurality of duct sections having an inlet, an outlet opposite the inlet, a sidewall, and a vent in the sidewall; each of the plurality of duct sections being configured such that the respective vent aligns with and encloses an exterior opening in the respective automatic transfer switch, the base duct section and the plurality of duct sections being connectable together to form a duct assembly configured to distribute the cooling airflow to the automatic transfer switches, wherein at least one of the plurality of modular duct sections has a cable retention feature attached with a sidewall of the modular duct section, the cable retention feature being configured to at least partially support one or more cables connected with one of the automatic transfer switches.

2. The modular cooling apparatus of claim 1, further comprising:
   one or more spacing sections, each one of the one or more spacing sections having an inlet, an outlet opposite the inlet, and a continuous sidewall; and each of the one or more spacing duct sections being connectable together with the plurality of modular duct sections such that the duct assembly is further configured for accommodating one or more empty spaces between the automatic transfer switches in the array of automatic transfer switches, the positions of each respective one of the one or more spacing sections corresponding to a respective one of the one or more empty spaces between the automatic transfer switches in the array.

3. The modular cooling apparatus of claim 1, wherein each of the plurality of modular duct sections has one or more attachment features adapted to attach the modular duct section to a respective one of the automatic transfer switches.

4. A modular cooling apparatus for cooling one or more electronic component enclosures in a rack located in a data center room, the modular cooling apparatus comprising:
   an intake duct section having an inlet and an outlet, the inlet being configured to be arranged abutting a floor of the data center to receive cooling air from a subfloor space of the data center, wherein the intake duct section is movable with respect to the floor while abutting the floor; and
   a duct assembly connected to the intake duct section, the duct assembly comprising one or more modular duct sections, each of the one or more modular duct sections having a vent and being configured such that the vent aligns with and encloses an exterior opening in a respective one of the one or more electronic component enclosures, wherein the duct assembly further comprises a duct cap attached with an outlet of a topmost of the modular duct sections, the duct cap comprising a fan configured to introduce air into the duct assembly to distribute cooling airflow to the one or more electronic component enclosures.

5. The modular cooling apparatus of claim 4, wherein the intake duct section inlet is configured to receive the cooling air emitted upwardly through one or more perforated panels in the floor.

6. The modular cooling apparatus of claim 4, further comprising one or more modular spacing sections, each of the one or more modular spacing sections being connectable to two of the modular duct sections, wherein each of the one or more modular spacing sections corresponds to a respective empty space below one of the one or more electronic component enclosures.

7. The modular cooling apparatus of claim 4, wherein:
   each of the one or more modular duct sections comprises a substantially circular inlet, a substantially circular outlet, and a substantially cylindrical sidewall; and
   the vent comprises a side opening formed in the substantially cylindrical sidewall shaped to accommodate a portion of one of the electronic component enclosures so as to position the opening of the electronic component enclosure within the modular duct section.

8. The modular cooling apparatus of claim 7, wherein the side opening of each of the one or more modular duct sections has a height corresponding to a height of a respective one of the one or more electronic component enclosures, such that the side opening accommodates a portion of the respective one of the electronic component enclosures when the modular duct section is attached to the electronic component enclosure.

9. The modular cooling apparatus of claim 4, wherein each of the one or more modular duct sections has a sidewall comprising a curved portion and a flat portion; and wherein the vent of each of the one or more modular duct sections comprises an opening in the flat portion.

10. The modular cooling apparatus of claim 4, wherein at least one of the one or more modular duct sections further comprises a cable retention feature attached to an exterior of a sidewall of the modular duct section, the cable retention feature being configured to at least partially support one or more cables connected with the one or more electronic component enclosures.

11. The modular cooling apparatus of claim 4, wherein the duct assembly further comprises one or more modular spacing sections, each of the one or more modular spacing sections being attachable in-line with the one or more modular duct sections.

12. The modular cooling apparatus of claim 4, wherein a first height of each of the one or more modular duct sections is configured to match a vertical distance between rails in the rack.

13. The modular cooling apparatus of claim 12, wherein the duct assembly further comprises one or more modular spacing sections, each of the one or more modular spacing sections being attachable in-line with the one or more modular duct sections; and
 a second height of each of the one or more modular spacing sections is configured to match a vertical distance between the rails in the rack.

14. The modular cooling apparatus of claim 4, wherein each of the one or more modular duct sections further comprises one or more attachment features for fixedly attaching each of the one or more modular duct sections to a respective one of the one or more electronic component enclosures.

15. The modular cooling apparatus of claim 4, wherein each of the one or more modular duct sections further comprises an inlet and an outlet, such that adjacent modular duct sections may removably attach to each other by a slip joint at the respective inlet and outlet of each of the adjacent modular duct sections.

16. A modular cooling apparatus for cooling one or more electronic component enclosures in a rack located in a data center room, the modular cooling apparatus comprising:
 an intake duct section having an inlet and an outlet, the inlet being configured to be arranged abutting a floor of the data center to receive cooling air from a subfloor space of the data center, wherein the intake duct section is movable with respect to the floor while abutting the floor; and
 a duct assembly connected to the intake duct section, the duct assembly comprising one or more modular duct sections, each of the one or more modular duct sections having a vent and being configured such that the vent aligns with and encloses an exterior opening in a respective one of the one or more electronic component enclosures, wherein each of the one or more modular duct sections further comprises an inlet and an outlet, such that adjacent modular duct sections may removably attach to each other by a slip joint at the respective inlet and outlet of each of the adjacent modular duct sections.

17. The modular cooling apparatus of claim 16, further comprising one or more modular spacing sections, each of the one or more modular spacing sections being connectible to two of the modular duct sections, wherein each of the one or more modular spacing sections corresponds to a respective empty space below one of the one or more electronic component enclosures.

18. The modular cooling apparatus of claim 16, wherein:
 each of the one or more modular duct sections comprises a substantially circular inlet, a substantially circular outlet, and a substantially cylindrical sidewall; and
 the vent comprises a side opening formed in the substantially cylindrical sidewall shaped to accommodate a portion of one of the electronic component enclosures so as to position the opening of the electronic component enclosure within the modular duct section.

19. The modular cooling apparatus of claim 16, wherein each of the one or more modular duct sections has a sidewall comprising a curved portion and a flat portion; and wherein the vent of each of the one or more modular duct sections comprises an opening in the flat portion.

20. The modular cooling apparatus of claim 16, further comprising a modular fan section, the modular fan section being attachable in-line with the one or more modular duct sections and comprising a powered fan for inducing a cooling airflow through the duct assembly.

\* \* \* \* \*